(12) United States Patent
Moriya

(10) Patent No.: US 11,437,257 B2
(45) Date of Patent: Sep. 6, 2022

(54) ROBOT HAND, WAFER TRANSFER ROBOT, AND WAFER TRANSFER APPARATUS

(71) Applicant: SAMSUNG ELECTRONICS CO., LTD., Suwon-si (KR)

(72) Inventor: Yoshiaki Moriya, Yokohama (JP)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 207 days.

(21) Appl. No.: 16/813,011

(22) Filed: Mar. 9, 2020

(65) Prior Publication Data

US 2020/0357674 A1 Nov. 12, 2020

(30) Foreign Application Priority Data

May 8, 2019 (JP) .............................. JP2019-088184
Sep. 10, 2019 (KR) ......................... 10-2019-0112294

(51) Int. Cl.
*H01L 21/677* (2006.01)
*H01L 21/67* (2006.01)
*H01L 21/683* (2006.01)

(52) U.S. Cl.
CPC .. *H01L 21/67766* (2013.01); *H01L 21/67196* (2013.01); *H01L 21/67248* (2013.01); *H01L 21/6831* (2013.01)

(58) Field of Classification Search
CPC ......... H01L 21/67766; H01L 21/67196; H01L 21/67248; H01L 21/6831; H01L 21/6833
See application file for complete search history.

(56) References Cited

U.S. PATENT DOCUMENTS

| 5,413,360 | A | 5/1995 | Atari et al. |
| 6,578,589 | B1 | 6/2003 | Mayusumi et al. |
| 9,437,468 | B2 | 9/2016 | Brun et al. |
| 2004/0070914 | A1* | 4/2004 | Ferreres ................ H02N 13/00 361/234 |
| 2010/0178139 | A1* | 7/2010 | Sundar ................ H01L 21/6831 414/225.01 |
| 2011/0064545 | A1* | 3/2011 | Ishikawa ........... H01L 21/67742 414/217 |
| 2014/0017041 | A1* | 1/2014 | Jung ....................... H01L 22/10 414/222.01 |
| 2015/0016010 | A1* | 1/2015 | Miwa ................ H01L 21/67742 361/234 |
| 2015/0022935 | A1* | 1/2015 | Cox ..................... H01L 21/6831 361/234 |

FOREIGN PATENT DOCUMENTS

| EP | 1189264 A1 | 3/2002 |
| EP | 1777571 B1 | 9/2006 |
| EP | 3078057 A1 | 10/2016 |
| JP | H06-291175 A | 10/1994 |
| JP | H09-82788 A | 3/1997 |
| JP | H11-68131 A | 3/1999 |
| JP | H11-354503 A | 12/1999 |
| JP | 2014-036070 A | 2/2014 |
| WO | 2015082874 A1 | 6/2015 |

* cited by examiner

*Primary Examiner* — Glenn F Myers
(74) *Attorney, Agent, or Firm* — Sughrue Mion, PLLC

(57) ABSTRACT

A robot hand is provided. The robot hand includes a transfer plate that has a loading region; an electrostatic chuck configured to adsorb a wafer disposed on the loading region of the transfer plate; and a heating element configured to heat the loading region of the transfer plate.

20 Claims, 4 Drawing Sheets

ROBOT HAND, WAFER TRANSFER ROBOT, AND WAFER TRANSFER APPARATUS

CROSS-REFERENCE TO RELATED APPLICATIONS

This application claims priority under 35 U.S.C § 119 to Japanese Patent Application No. 2019-088184, filed on May 8, 2019 in the Japanese Patent Office, and Korean Patent Application No. 10-2019-0112294, filed on Sep. 10, 2019 in the Korean Intellectual Property Office, the contents of which are hereby incorporated by reference in their entireties.

BACKGROUND

Example embodiments of the present disclosure relate to a robot hand, a wafer transfer robot, and a wafer transfer apparatus.

A semiconductor fabrication facility performs, for example, a film deposition process, an etching process, an ion implantation process, and the like on a semiconductor wafer (referred to herein as a wafer). The semiconductor fabrication facility includes a susceptor that loads the wafer in a chamber where pressure can be reduced. A cooling member cools the wafer loaded on the susceptor, and a fabrication process, such as a film deposition process, an etching process, an ion implantation process, and the like, may be performed on the wafer. An electrostatic chuck disposed on the susceptor adsorbs the wafer and fixes the wafer onto the susceptor. The semiconductor fabrication facility uses a wafer transfer robot to transfer the wafer between chambers. The wafer transfer robot may use a robot hand connected with an end of an arm to load the wafer on a loading surface of the susceptor or to unload the loaded wafer.

The semiconductor fabrication facility may cool the wafer to a temperature, for example, about 100° C. below zero in a high-vacuum chamber. Therefore, when the wafer that has been cooled in the chamber is unloaded and introduced into atmospheric environment at room temperature, dew condensation or frost (referred to herein as condensation) may form on the wafer. The formation of condensation on the wafer may have an adverse effect on thin layers formed on the wafer. Accordingly, to prevent the formation of condensation on the wafer, it is necessary to first return the temperature of the wafer back to room temperature and then to introduce the wafer into atmospheric environment.

The process chamber or a transfer chamber may be used to heat the wafer. When the wafer is heated in the chamber, production throughput may decrease due to the time required the wafer to be heated.

SUMMARY

One or more example embodiments provide a robot hand configured to heat the wafer during transfer, a wafer transfer robot equipped with the robot hand, and a wafer transfer apparatus associated with the wafer transfer robot.

According to an aspect of example embodiment, there is provided a robot hand that includes a transfer plate that has a loading region; an electrostatic chuck configured to adsorb a wafer disposed on the loading region of the transfer plate; and a heating element configured to heat the loading region of the transfer plate.

According to an example embodiment, there is provided a wafer transfer robot including: a robot hand configured to transfer a wafer from a first chamber to a second chamber, the robot hand comprising: a transfer plate that has a loading region; an electrostatic chuck configured to adsorb the wafer to the loading region of the transfer plate; and a heating element configured to heat the loading region of the transfer plate while the wafer is transferred from the first chamber to the second chamber.

According to an aspect of an example embodiment, there is provided a wafer transfer apparatus including: a first chamber configured to provide a first pressure that is less than an atmospheric pressure at a first temperature; a second chamber configured to provide the atmospheric pressure at a second temperature that is greater than the first temperature; and a robot hand configured to transfer a wafer from the first chamber to the second chamber. The robot hand includes: a transfer plate that has a loading region; an electrostatic chuck configured to adsorb the wafer to the loading region of the transfer plate; and a heating element configured to heat the loading region of the transfer plate while the wafer is transferred from the first chamber to the second chamber.

BRIEF DESCRIPTION OF THE DRAWINGS

The above and/or other aspects will be more clearly understood from following description of illustrative, non-limiting example embodiments, in conjunction with the accompanying drawings, in which.

DETAILED DESCRIPTION

The following will now describe in detail some example embodiments of the present disclosure with reference to the accompanying drawings.

Since each component of the drawings used in the following description is intended to be easily seen, the dimensions in the component can be different for each sole size, and it is not expected that dimensional ratios of each component are limited to actual ratios. In addition, the following materials and dimensions are merely exemplary, and embodiments are not necessarily limited thereto, but may be variously changed within the scope and spirit of the present disclosure.

Figure 1:
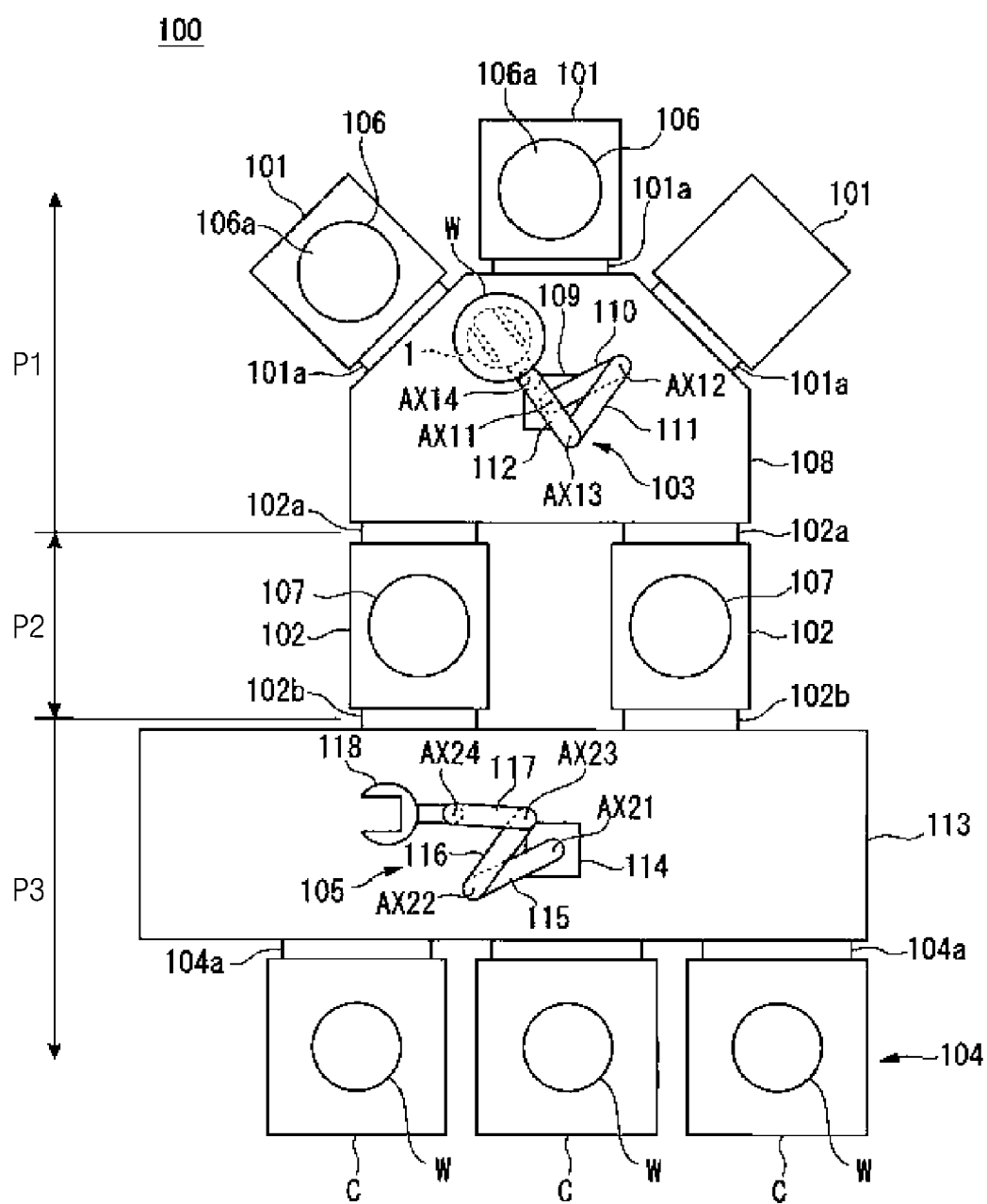
FIG. 1 illustrates a plan view of a semiconductor fabrication facility according to one or more example embodiments.
Figure 2:
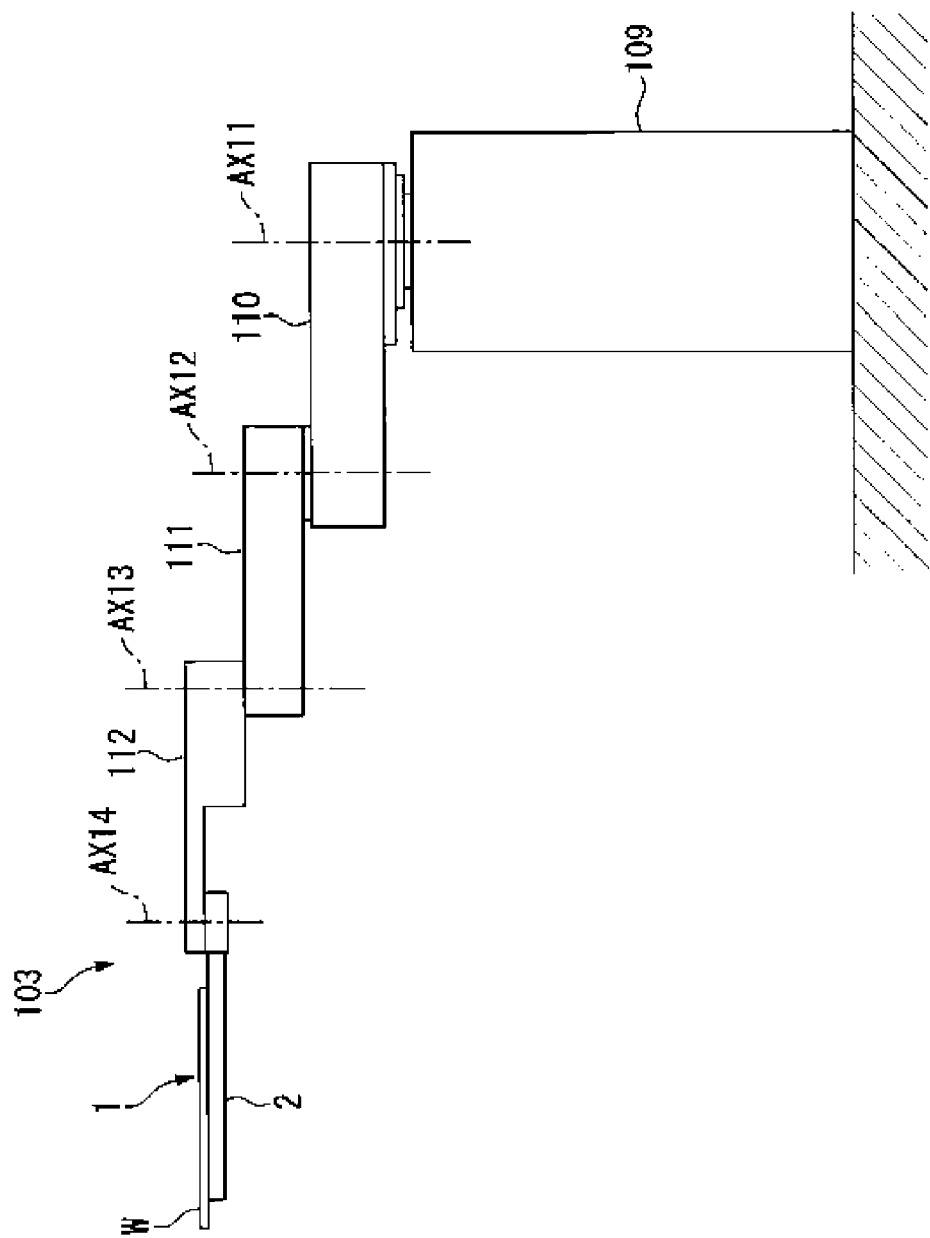
FIG. 2 illustrates a side view of a wafer transfer robot included in the semiconductor fabrication facility according to one or more example embodiments.

FIG. 1 illustrates a plan view showing a configuration of a semiconductor fabrication facility 100 according to some example embodiments. FIG. 2 illustrates a side view showing a configuration of a first wafer transfer robot 103 included in the semiconductor fabrication facility 100.

Referring to FIG. 1, the semiconductor fabrication facility 100 according to an example embodiment may perform different processes on a semiconductor wafer W (referred to herein as a wafer). For example, the semiconductor fabrication facility 100 may perform a film deposition process, an etching process, an ion implantation process, and the like on the wafer W. The wafer W may be, for example, a silicon wafer having a diameter of about 300 mm and a thickness of about 0.8 mm. The semiconductor fabrication facility 100 may be installed in a cleanroom whose indoor atmosphere (air) is managed to provide cleanliness. The semiconductor fabrication facility 100 may include a plurality of process chambers 101, a plurality of transfer chambers 102, a first wafer transfer robot 103, a load port 104, and a second wafer transfer robot 105. For example, the semiconductor fabrication facility 100 may include three process chambers 101 and two transfer chambers 102. The semiconductor fabrication facility 100 may have a first part P1, a second part P2, and a third part P3. Chambers in the first part P1 may be controlled to be under vacuum (i.e., a pressure that is less than atmospheric pressure). Chambers in the third part P3 may have atmospheric pressure. The second part P2 may connect the first part P1 to the third part P3.

The process chamber 101 may be a chamber in which a process is performed on the wafer W, and may have an inside that may be evacuated to high vacuum. One or more (e.g., two) of the plurality of process chambers 101 may include a susceptor 106 that with a loading surface 106a and a cooling member. The wafer W may be loaded on the loading surface 106a, and a cooling member may cool the wafer W on the loading surface 106a of the susceptor 106. The cooling member may cool the wafer W to about 100° C. below zero. The process chamber 101 may cool the wafer W under reduced pressure, and may perform a film deposition process, an etching process, and an ion implantation process on the wafer W. An electrostatic chuck equipped to the susceptor 106 may be used to adsorb the wafer W loaded on the loading surface 106a, and thus the wafer W may be fixed to the loading surface 106a.

The transfer chamber 102 may be a chamber that transfers the wafer W, and may be configured to be evacuated to high vacuum. The transfer chamber 102 may include a positioning stage 107 and a heating member. When the wafer W is loaded, the positioning stage 107 may rotate to determine a position of the wafer W, and the heating member may heat the wafer W loaded on the positioning stage 107. A pressure of the transfer chamber 102 may be greater than an internal pressure of chambers in the first part P1 and less than an external atmospheric pressure. When the wafer W is unloaded after a process, the heating member in the transfer chamber 102 may heat the wafer W cooled in the process chamber 101. Therefore, a temperature of the wafer W may be returned back to room temperature (or, a temperature at which no condensation occurs).

The first wafer transfer robot 103 may be a selective compliance arm for robotic assembly (SCARA) robot whose arm associated with a robot hand is driven to move in a horizontal direction, and under reduced pressure, may transfer the wafer W between the process chamber 101 and the transfer chamber 102.

For example, as shown in FIG. 2, the first wafer transfer robot 103 may include a first arm 110 that is rotatable around a first rotational axis AX11 relative to a base 109, a second arm 111 that is rotatable around a second rotational axis AX12 relative to an end of the first arm 110, a third arm 112 that is rotatable around a third rotational axis AX13 relative to an end of the second arm 111, and a robot hand 1 that is rotatable around a fourth rotational axis AX14 relative to an end of the third arm 112.

As shown in FIG. 1, the first wafer transfer robot 103 may transfer the wafer W between the process chamber 101 and the transfer chamber 102, while rotating the robot hand 1 and the first, second, and third arms 110, 111, and 112.

The first wafer transfer robot 103 may be installed within a first transfer chamber 108 capable of reducing pressure. The first transfer chamber 108 may be configured to be evacuated to high vacuum that corresponds to the reduced pressure of the process chamber 101. The first transfer chamber 108 may be connected to the process chamber 101 through a shutter 101a. The first transfer chamber 108 may be connected to the transfer chamber 102 through a shutter 102a.

When the shutters 101a and 102a are opened, the first wafer transfer robot 103 in the first transfer chamber 108 may transfer the wafer W from the process chamber 101 to the transfer chamber 102 or from the transfer chamber 102 to the process chamber 101. When the shutters 101a and 102a are closed, the first wafer transfer robot 103 in the first transfer chamber 108 may not transfer the wafer between the process chamber 101 and transfer chamber 102.

The load port 104 may include a plurality of wafer carriers C and an elevation member that moves the wafer carriers C upwards and downwards. For example, the load port 104 may include three wafer carriers C. The wafer carrier C may receive a plurality of wafers W that are vertically stacked. The elevation member of the load port 104 may change a height of the wafer W received in the wafer carrier C. The wafer W may be selectively loaded into or unloaded from the load port 104.

The second wafer transfer robot 105 may be a SCARA robot whose arm equipped with a robot hand is driven to move in a horizontal direction, and under reduced pressure, may transfer the wafer W between the transfer chamber 102 and the wafer carrier C.

For example, the second wafer transfer robot 105 may include a first arm 115 that is rotatable around a first rotational axis AX21 relative to a base 114, a second arm 116 that is rotatable around a second rotational axis AX22 relative to an end of the first arm 115, a third arm 117 that is rotatable around a third rotational axis AX23 relative to an end of the second arm 116, and a robot hand 118 that is rotatable around a fourth rotational axis AX24 relative to an end of the third arm 117.

The second wafer transfer robot 105 may transfer the wafer W from the wafer carrier C to the transfer chamber 102 or from the transfer chamber 102 to the wafer carrier C, while rotating the robot hand 118 and the first, second, and third arms 115, 116, and 117.

The second wafer transfer robot 105 may be installed within a second transfer chamber 113. The second transfer chamber 113 may be connected to the load port 104 through a shutter 104a. The second transfer chamber 113 may be connected to the transfer chamber 102 through a shutter 102b.

When the shutters 104a and 102b are opened, the second wafer transfer robot 105 in the second transfer chamber 113 may transfer the wafer W from the wafer carrier C to the transfer chamber 102 or from the transfer chamber 102 to the wafer carrier C.

In the semiconductor fabrication facility 100, the first wafer transfer robot 103 may transfer the wafer W between the process chamber 101 and the transfer chamber 102.

The first wafer transfer robot 103 may transfer the wafer W from the process chamber 101 to the transfer chamber 102. Because the process chamber 101 has a temperature less than that of the transfer chamber 102, when removed from the process chamber 101, the wafer W may have a temperature that is lower than the temperature in the transfer chamber 102. To prevent formation of condensation on the wafer W due to a difference in temperature between the wafer W and the transfer chamber 102, the robot hand 1 may be configured to heat the wafer W during transfer.

A configuration of the robot hand 1 will be described below in detail with reference to FIGS. 3, 4, and 5.

Figure 3:
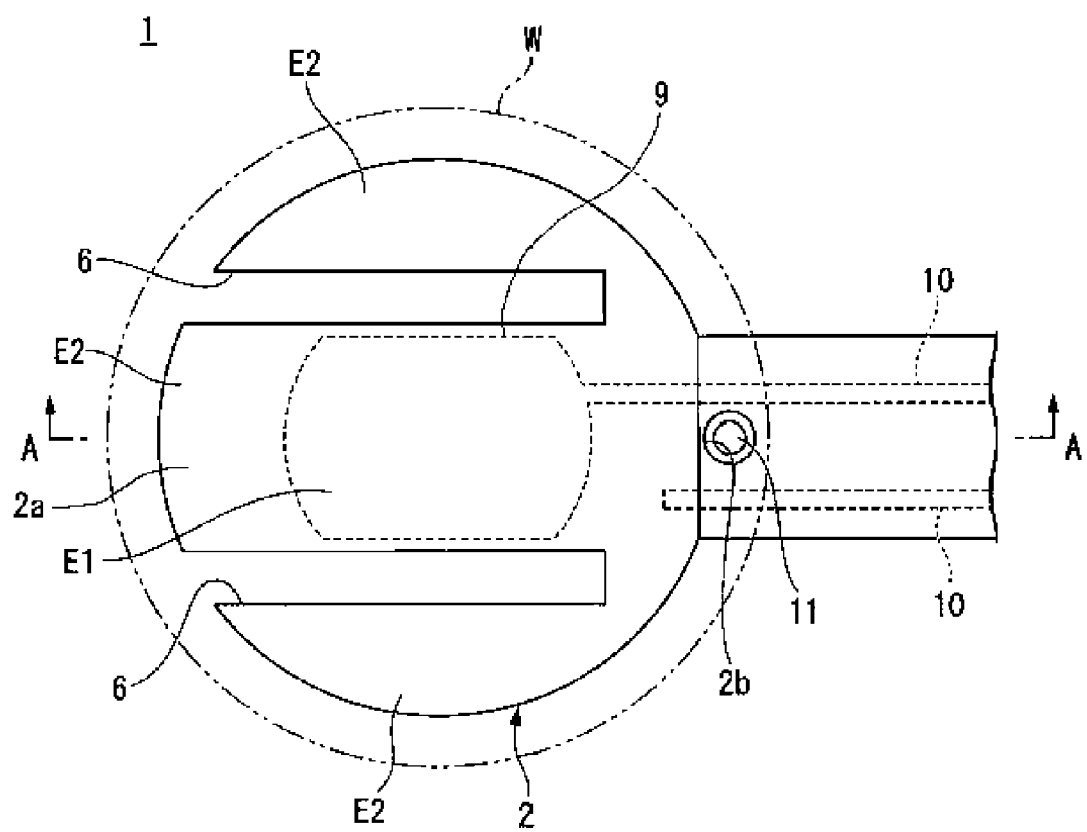
FIG. 3 illustrates a plan view showing a robot hand according to one or more example embodiments.

FIG. 3 illustrates a plan view showing a configuration of the robot hand 1. FIG. 4 illustrates a cross-sectional view taken along line A-A of FIG. 3. FIG. 5 illustrates a cross-sectional view showing other configuration of a transfer plate 2 included in the robot hand 1.

Figure 4:
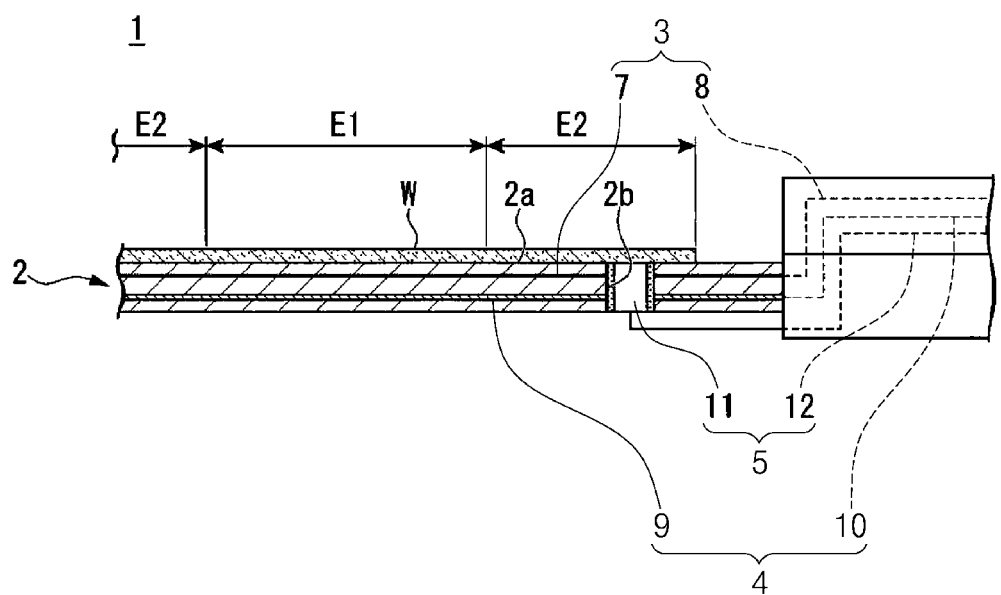
FIG. 4 illustrates a cross-sectional view taken along line A-A of FIG. 3.
Figure 5:
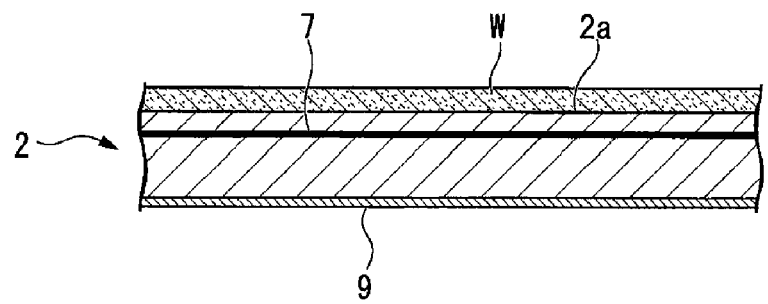
FIG. 5 illustrates a cross-sectional view of a transfer plate included in the robot hand according to one or more example embodiments.

Referring to FIGS. 3 and 4, the robot hand 1 may include a transfer plate 2 that has a loading region 2a on which the wafer W is loaded, an adsorption member 3 that adsorbs the wafer W loaded on the loading region 2a of the transfer plate 2, a heating member 4 that heats the wafer W loading on the loading region 2a of the transfer plate 2, and a temperature measurement member 5 that measures a temperature of the wafer W loaded on the loading region 2a of the transfer plate 2.

The transfer plate 2 may include at least one substrate formed of one selected from silicon carbide (SiC), aluminum nitride (AlN), aluminum oxide ($Al_2O_3$), silicon nitride ($Si_3N_4$), and silicon dioxide ($SiO_2$). The transfer plate 2 may have a structure in which a plurality of substrates are stacked. The transfer plate 2 may have a thickness equal to or less than 10 mm at the loading region 2a. For example, the transfer plate 2 may have a thickness ranging from 3 mm to 8 mm at the loading region 2a.

The transfer plate 2 may have a disc shape. The transfer plate 2 may have a diameter less than that of the wafer W. The transfer plate 2 may have a pair of slits 6. The pair of slits 6 may be a part through which a pin of the susceptor 106 passes. The pair of slits 6 may be formed when the transfer plate 2 is cut to have hollow portions that extend in parallel, at a constant interval away from each other, from both sides of an end of the transfer plate 2 toward a base side of the transfer plate 2.

The adsorption member 3 may have an electrostatic chuck. When a voltage is applied to an electrode 7, the electrostatic chuck may use a Johnsen-Rahbek (JR) force, which is generated between the adsorption member 3 and the wafer W, to adsorb the wafer W onto the loading region 2a. The electrode 7 may be made of a conductive layer including a refractory metallic material, such as tungsten (W), molybdenum (Mo), or platinum (Pt). The electrode 7 may be formed between substrates that constitute the transfer plate 2. The electrode 7 may be supplied with power through a feeder 8 disposed on a side of the transfer plate 2.

The heating member 4 may include a heating resistance element 9 disposed on a surface or in an inside of the transfer plate 2. It may be preferable that the heating resistance element 9 has a resistance change rate equal to or less than 10% in a temperature range between 200° C. below zero and 400° C. above zero. The heating resistance element 9 may include either a refractory metal, such as tungsten (W), molybdenum (Mo), and titanium (Ti), or carbide thereof.

The heating resistance element 9 may be formed to have a narrow film shape, and may be disposed between substrates that constitute the transfer plate 2. The heating resistance element 9 may be placed below the loading region 2a. For example, the heating resistance element 9 may be located at a lower level than that of the electrode 7.

The heating resistance element 9 may be supplied with power through a feeder 10 disposed on a side of the transfer plate 2. Therefore, the heating resistance element 9 may generate heat to heat the wafer W loaded on the loading region 2a.

The heating resistance element 9 may be disposed in parts on a central portion E1 and a peripheral portion E2 of the loading region 2a. In this configuration, it may be possible to independently heat the central portion E1 and the peripheral portion E2.

The central portion E1 of the loading region 2a may be interposed between the pair of slits 6. When viewed in plan, the peripheral portion E2 of the loading region 2a may surround the central portion E1. The central portion E1 and the peripheral portion E2 of the loading region 2a may have almost the same area.

The temperature measurement member 5 may include a temperature sensor 11 provided in the transfer plate 2. The temperature sensor 11 may be disposed within an aperture 2b that vertically penetrates the transfer plate 2. A heat-resistant adhesive may be used to fix the temperature sensor 11 to an inside of the aperture 2b.

The temperature sensor 11 may contact an outer portion of the wafer W loaded on the loading region 2a, and may thereby measure a temperature of the wafer W. The temperature sensor 11 may provide a temperature signal to a temperature controller through a signal line 12 equipped on a side of the transfer plate 2.

The temperature controller may control the power supplied to the heating resistance element 9, based on the temperature signal provided from the temperature sensor 11. Accordingly, it may be possible to control a heating temperature of the wafer W.

As shown in FIG. 4, the heating resistance element 9 may be provided between substrates that constitute the transfer plate 2. Example embodiments, however, are not limited thereto, and as shown in FIG. 5, the heating resistance element 9 may be disposed on a location opposite to the loading region 2a of the transfer plate 2.

The adsorption member 3 of the robot hand 1 may adsorb the wafer W loaded on the loading region 2a of the transfer plate 2. In this case, the wafer W may be flattened on the transfer plate 2. When the adsorption member 3 adsorbs the wafer W onto the loading region 2a, the wafer W may be rigidly placed on the loading region 2a even when the wafer W is transferred.

The heating member 4 of the robot hand 1 may heat the wafer W loaded on the loading region 2a of the transfer plate 2. Therefore, when the wafer W is transferred, it may be possible to return the temperature of the wafer W back to room temperature. The heating process of the wafer W by the heating member 4 may be a separate process from the heating process of the wafer W in the transfer chamber 102.

According to some example embodiments, the semiconductor fabrication facility 100 may be configured such that the robot hand 1 may heat the wafer W while being transferred from the process chamber 101 in which the wafer W has a relatively lower temperature under reduced pressure, to the transfer chamber 102 in which the wafer W has a relatively higher temperature under atmospheric pressure. The temperature of the wafer W may thus be returned back to room temperature, and as a result, it may be possible to prevent formation of condensation on the wafer W.

The robot hand 1 may provide the wafer W with heat from the central portion E1 of the loading region 2a. For example, because the wafer W has excellent thermal conductivity, when the heating resistance element 9 heats the wafer W disposed on the central portion E1, heat may be transferred from the central portion E1 toward the peripheral portion E2. Therefore, a temperature at the peripheral portion E2 of the loading region 2a may become increased. The temperature sensor 11 may measure a temperature at a peripheral area of the wafer W. When the temperature sensor 11 detects an increase in temperature of the wafer W, the peripheral portion E2 of the loading region 2a may heat the wafer W. The wafer W may thus be efficiently heated at its overall area, and as a result, it may be possible to promptly return the temperature of the wafer W back to room temperature. The method of using the robot hand 1 to heat the wafer W is not limited to that mentioned above, but may be variously changed. For example, the wafer W may be heated such that heat is allowed to transfer from peripheral to central areas of the wafer W.

The semiconductor fabrication facility 100 may return the temperature of the wafer W back to room temperature to prevent the formation of condensation on a surface of the wafer W while the wafer W that has been cooled in the process chamber 101 is unloaded and introduced into external atmospheric pressure at room temperature.

The semiconductor fabrication facility 100 may be configured such that, the wafer W may be heated in the transfer chamber 102 and by the robot hand 1 may heat the wafer W during transfer. The case where the wafer W is heated during transfer may have an increased throughput, compared to the case where the wafer W is heated in the transfer chamber 102.

Example embodiments, however, are not limited to the example embodiment above, but may be variously changed within the scope and spirit of the present disclosure. For example, for one or more example embodiments provide a wafer transfer apparatus configured to transfer a wafer between a chamber which has a relatively lower temperature under reduced pressure and a chamber in which the wafer has a relatively higher temperature an atmospheric pressure.

Example embodiments are not limited to a wafer transfer robot whose configuration is the same as that of the first wafer transfer robot 103, but may be broadly applicable to any wafer transfer robot capable of being equipped with the robot hand 1.

The transfer plate 2 of the robot hand 1 may be variously modified, and is not limited to a shape having the pair of slits 6 whose position corresponds to that of a pin of the susceptor 106.

One or more example embodiments, provide a robot hand configured to heat a wafer during transfer, a wafer transfer robot equipped with the robot hand, and a wafer transfer apparatus associated with the wafer transfer robot.

While example embodiments have been shown and described above, it will be apparent to those skilled in the art that modifications and variations could be made without departing from the scope of the present inventive concept as defined by the appended claims.

What is claimed is:

1. A robot hand comprising:
a transfer plate that has a loading region;
an electrostatic chuck configured to adsorb a wafer disposed on the loading region of the transfer plate;
a temperature sensor provided in an aperture of the transfer plate; and
a heating element configured to heat the loading region of the transfer plate.

2. The robot hand of claim 1, wherein the heating element comprises a heating resistance element disposed on a surface of or within the transfer plate.

3. The robot hand of claim 2, wherein the heating resistance element comprises a first element disposed in a central portion of the loading region and a second element disposed in a peripheral portion of the loading region.

4. The robot hand of claim 2, wherein the electrostatic chuck comprises an adsorption electrode configured to adsorb the wafer onto the loading region based on a voltage being applied to the adsorption electrode.

5. The robot hand of claim 2, further comprising a temperature measurement circuit configured to measure a temperature of the wafer disposed on the loading region of the transfer plate based on a temperature signal provided by the temperature sensor.

6. The robot hand of claim 1, wherein the temperature sensor is configured to contact the wafer.

7. The robot hand of claim 2, wherein the transfer plate comprises at least one substrate formed of one selected from among silicon carbide (SiC), aluminum nitride (AlN), aluminum oxide ($Al_2O_3$), silicon nitride ($Si_3N_4$), and silicon dioxide ($SiO_2$).

8. The robot hand of claim 2, wherein the transfer plate, at the loading region, has a thickness equal to or less than 10 mm.

9. The robot hand of claim 1, wherein the electrostatic chuck comprises an adsorption electrode configured to adsorb and is configured to adsorb the wafer onto the loading region based on a voltage being applied to the adsorption electrode.

10. The robot hand of claim 9, further comprising a temperature measurement circuit configured to measure a temperature of the wafer disposed on the loading region of the transfer plate based on a temperature signal provided by the temperature sensor.

11. The robot hand of claim 9, wherein the transfer plate comprises at least one substrate formed of one of silicon carbide (SiC), aluminum nitride (AlN), aluminum oxide ($Al_2O_3$), silicon nitride ($Si_3N_4$), or silicon dioxide ($SiO_2$).

12. The robot hand of claim 1, further comprising a temperature measurement member that measures a temperature of the wafer disposed on the loading region of the transfer plate based on a temperature signal provided by the temperature sensor.

13. The robot hand of claim 12, wherein the temperature sensor is configured to contact the wafer.

14. The robot hand of claim 12, wherein the transfer plate comprises at least one substrate formed of one of silicon carbide (SiC), aluminum nitride (AlN), aluminum oxide ($Al_2O_3$), silicon nitride ($Si_3N_4$), or silicon dioxide ($SiO_2$).

15. The robot hand of claim 12, wherein the transfer plate has a thickness equal to or less than 10 mm at the loading region.

16. A wafer transfer robot comprising:
a robot hand configured to transfer a wafer from a first chamber to a second chamber, the robot hand comprising:
a transfer plate that has a loading region;
a temperature sensor provided in an aperture of the transfer plate;
an electrostatic chuck configured to adsorb the wafer to the loading region of the transfer plate; and
a heating element configured to heat the loading region of the transfer plate while the wafer is transferred from the first chamber to the second chamber.

17. The wafer transfer robot of claim 16, wherein the robot hand is disposed on an arm of a selective compliance arm for robotic assembly (SCARA) robot, the SCARA robot being configured to drive the arm to move in a horizontal direction.

18. A wafer transfer apparatus comprising:
- a first chamber configured to provide a first pressure that is less than an atmospheric pressure at a first temperature;
- a second chamber configured to provide the atmospheric pressure at a second temperature that is greater than the first temperature; and
- a robot hand configured to transfer a wafer from the first chamber to the second chamber, the robot hand comprising:
  - a transfer plate that has a loading region;
  - a temperature sensor provided in an aperture of the transfer plate;
  - an electrostatic chuck configured to adsorb the wafer to the loading region of the transfer plate; and
  - a heating element configured to heat the loading region of the transfer plate while the wafer is transferred from the first chamber to the second chamber.

19. The wafer transfer apparatus of claim 18,
- wherein the heating element is further configured to heat the loading region based on the a temperature of the wafer measured by the temperature sensor.

20. The robot hand of claim 1, wherein the transfer plate defines a first slit and a second slit,
- wherein the first slit and the second slit extend from a top surface of the transfer plate to a bottom surface of the transfer plate, and
- wherein the first slit and the second slit extend in parallel at a constant interval from an end of the transfer plate.

* * * * *